(12) United States Patent
Ebi et al.

(10) Patent No.: US 6,953,644 B2
(45) Date of Patent: Oct. 11, 2005

(54) METHOD FOR COMPENSATING FOR SCATTER/REFLECTION EFFECTS IN PARTICLE BEAM LITHOGRAPHY

(75) Inventors: Christian Ebi, Haimhausen (DE); Frank Erber, München (DE); Torsten Franke, München (DE); Fritz Gans, Dresden (DE); Tarek Lutz, München (DE); Günther Ruhl, Dorfen (DE); Bernd Schönherr, Blaustein (DE)

(73) Assignee: Infineon Technologies AG, Munich (DE)

( * ) Notice: Subject to any disclaimer, the term of this patent is extended or adjusted under 35 U.S.C. 154(b) by 126 days.

(21) Appl. No.: 10/408,806

(22) Filed: Apr. 7, 2003

(65) Prior Publication Data

US 2003/0228527 A1 Dec. 11, 2003

(30) Foreign Application Priority Data

Apr. 5, 2002 (DE) .......................................... 102 15 193

(51) Int. Cl.⁷ ................................................. G03F 9/00
(52) U.S. Cl. .......................... 430/30; 430/296; 430/942
(58) Field of Search ........................... 430/30, 296, 942

(56) References Cited

U.S. PATENT DOCUMENTS

| | | | |
|---|---|---|---|
| 5,210,696 A | 5/1993 | Yano | 716/21 |
| 6,291,119 B2 | 9/2001 | Choi et al. | 430/30 |
| 6,361,911 B1 * | 3/2002 | Tsai et al. | 430/30 |
| 2001/0016295 A1 | 8/2001 | Choi et al. | 430/30 |

FOREIGN PATENT DOCUMENTS

| | | |
|---|---|---|
| DE | 41 30 895 A1 | 4/1992 |
| DE | 198 40 833 A1 | 3/2000 |
| JP | 59167018 A | 9/1984 |

* cited by examiner

*Primary Examiner*—Christopher G. Young
(74) *Attorney, Agent, or Firm*—Laurence A. Greenberg; Werner H. Stemer; Ralph E. Locher

(57) ABSTRACT

A method for compensating for scatter/reflection effects in particle beam lithography includes the following steps: providing at least one layer of a material that is sensitive to particle beams, using at least one particle beam to write predetermined patterns in a limited area of the material that is sensitive to particle beams, and using at least one particle beam to write at least one frame, which surrounds the limited area, into the material that is sensitive to particle beams so that variations in the background dose within the limited area are less than 30% of the maximum background dose within the limited area. This provides the advantage that a considerably more homogeneous background dose and hence considerably less variation in the CD measure, can be produced within the area that is written to by the particle beam, in a simple and cost-effective manner.

11 Claims, 3 Drawing Sheets

METHOD FOR COMPENSATING FOR SCATTER/REFLECTION EFFECTS IN PARTICLE BEAM LITHOGRAPHY

BACKGROUND OF THE INVENTION

FIELD OF THE INVENTION

The present invention relates to a method for compensating for scatter/reflection effects in particle beam lithography. In particular, the present invention relates to a method for compensating for scatter/reflection effects during the production of masks for semiconductor manufacture.

Particle beams, in particular electron beams, are being used increasingly for producing masks for manufacturing semiconductors. This is done, for example, by applying a resist layer, which is sensitive to electron beams, to a layer that will be structured, and by writing the desired pattern into the resist layer that is sensitive to electron beams using an electron beam. The resist layer is then developed, so that a resist layer with a desired pattern is produced. The pattern of the resist mask is then transferred into the layer to be structured by performing a subsequent etching step. This allows not only masks for photolithography, but also structures to be produced directly on the semiconductor wafer.

This production process will be described in somewhat more detail in the following text with reference to FIG. 5. In order to produce a mask for photolithography, a layer 11 that is impermeable to radiation and/or a so-called half-tone layer, for example, are/is applied to a substrate 10 that is permeable to radiation. A half-tone layer is in this case a layer through which a predetermined percentage (for example 3–10%) of the radiation can pass and which at the same time shifts the phase of the radiation passing through it by a predetermined amount, generally 180°. A resist layer 12 that is sensitive to electron beams is applied to the layer 11, and the desired pattern is written into the resist layer which is sensitive to electron beams, by using an electron beam 14.

Unfortunately, the electron beam 14 is partially reflected and scattered from the surface of the resist layer that is sensitive to electron beams, in the direction of the electron optics 15. The electrons 16 which are reflected or scattered from the surface of the resist layer 12, which is sensitive to electron beams, are once again partially reflected or scattered on the electron optics 15 in the direction of the resist layer that is sensitive to electron beams. This results in the electrons arriving not only at the desired locations on the resist layer 12 that is sensitive to electron beams, but also in areas of the resist layer 12 that are not intended to be subjected to irradiation by electrons.

The irradiation of the resist layer that is sensitive to electron beams thus leads to a type of background dose which, however, may vary from point to point as a function of the desired pattern. Particularly at the edge of the pattern, the background dose caused by reflection and scatter decreases sharply. Unfortunately, the dimensional stability of the structure transfer, the so-called CD measure (critical dimension) is governed to a major extent by the background dose. The lateral variation of the background dose accordingly results in lateral variations in the CD measure, which may result in imaging errors.

In order to overcome this problem, U.S. patent application Ser. No. 2001/0016295 A1, for example, has proposed subdividing the desired pattern or the area being written into square subareas, calculating the resultant background dose for each of these subareas, calculating an additional irradiation dose for each of these subareas and, finally carrying out an additional irradiation with different irradiation patterns in each subarea so that, in the end, all of the subareas have essentially the same background dose.

Unfortunately, due to the relatively long range of the scatter/reflection effects (>10 mm), this solution is dependant on extensive calculations to determine the background dose that results for each subarea and to determine the corresponding compensation dose, which necessitates additional computational capacity in the electron beam appliance, or in the vicinity of the electron beam appliance. In order to keep the computation time within limits, only the short-range component of the scatter/reflection effects is thus often compensated for. In addition, the additional irradiation of each subarea of the desired pattern considerably lengthens the process time.

SUMMARY OF THE INVENTION

It is accordingly an object of the invention to provide a method for compensating for scatter effects in particle beam lithography, which reduces or completely avoids the above-mentioned disadvantages of the prior art methods of this general type.

With the foregoing and other objects in view there is provided, in accordance with the invention, a method for compensating for scatter effects in particle beam lithography. The method includes steps of: providing at least one layer of a material that is sensitive to particle beams; using at least one particle beam for writing predetermined patterns in a limited area of the material that is sensitive to particle beams; and using at least one particle beam for writing at least one frame, surrounding the limited area, into the material that is sensitive to particle beams so that variations in a background dose within the limited area are less than 30% of a maximum background dose within the limited area.

In accordance with an added feature of the invention, the particle beam used to write the predetermined patterns is an electron beam; and the particle beam used to write the frame is an electron beam.

According to the invention, a method is provided for compensation for scatter/reflection effects in particle beam lithography, including the following steps:
a) providing at least one layer of a material which is sensitive to particle beams;
b) writing predetermined patterns in a limited area of the material that is sensitive to particle beams, using at least one particle beam; and
c) writing at least one frame, which surrounds the limited area, into the material that is sensitive to particle beams, using at least one particle beam, so that the variations in the background dose within the limited area are less than 30% of the maximum background dose within the limited area.

The inventive method has the advantage that a considerably more homogeneous background dose, and hence considerably reduced variations in the CD measure within the area which is written to by the particle beam, can be produced in a simple and cost-effective manner. Complex calculations for compensation irradiation within the area to be written to by the particle beam can be avoided. In particular, it is possible to largely compensate for the drop-off in the background dose, and hence for the variations resulting from this in the dimensional stability at the edge of the limited area. Since the frame can be written to using a relatively broad particle beam (relatively large spot size), the inventive method leads to an only insignificant increase in the total irradiation time.

Furthermore, existing particle beam appliances can be used without further changes. There is no need for any additional computation capacity. There is likewise no need for any additional absorbent materials in the vicinity of the particle optics, in order to absorb reflected or scattered particles.

Step b) need not necessarily be carried out before step c) in the inventive method. Depending on the application, the frame may also be produced before or at the same time as the predetermined patterns. The inventive method can be used with a large number of particle beams, for example, with ion beams. However, it is preferable for an electron beam to be used as the particle beam.

According to a further preferred embodiment of the inventive method, the frame is at a predetermined distance from the limited area. In this case, it is particularly preferable for the dose used to irradiate the frame to be chosen such that the frame can be seen when the material that is sensitive to particle beams is being developed.

According to a further preferred embodiment of the inventive method, the frame is directly adjacent to the limited area. In this case, it is particularly preferable for the dose used to irradiate the frame to be chosen such that the frame cannot be seen when the material that is sensitive to particle beams is being developed.

According to a further preferred embodiment of the inventive method, the frame overlaps the edge area of the limited area. In this case, it is particularly preferable for the dose used to irradiate the frame to be chosen such that it corresponds to the mean background dose within the frame.

According to a further preferred embodiment of the inventive method, at least one frame which surrounds the limited area is written into the material which is sensitive to particle beams, so that the variations in the background dose within the limited area are less than 20% of the maximum background dose within the limited area. It is also preferable for the dose with which the frame is irradiated to be varied within the frame, in particular in accordance with the adjacent patterns.

Other features which are considered as characteristic for the invention are set forth in the appended claims.

Although the invention is illustrated and described herein as embodied in a method for compensation for scatter/reflection effects in particle beam lithography, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
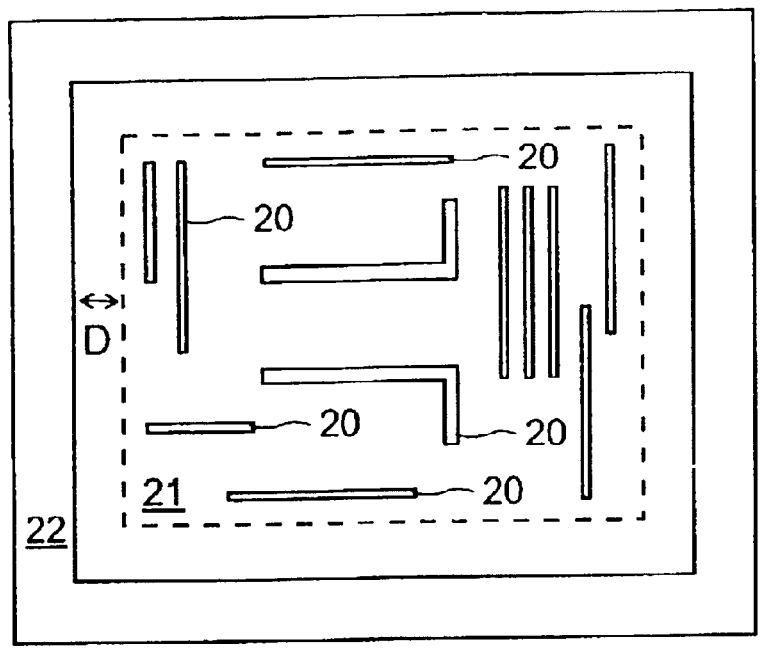
FIG. 1 is a schematic view of a mask produced according to a first preferred embodiment of the inventive method.
Figure 5:
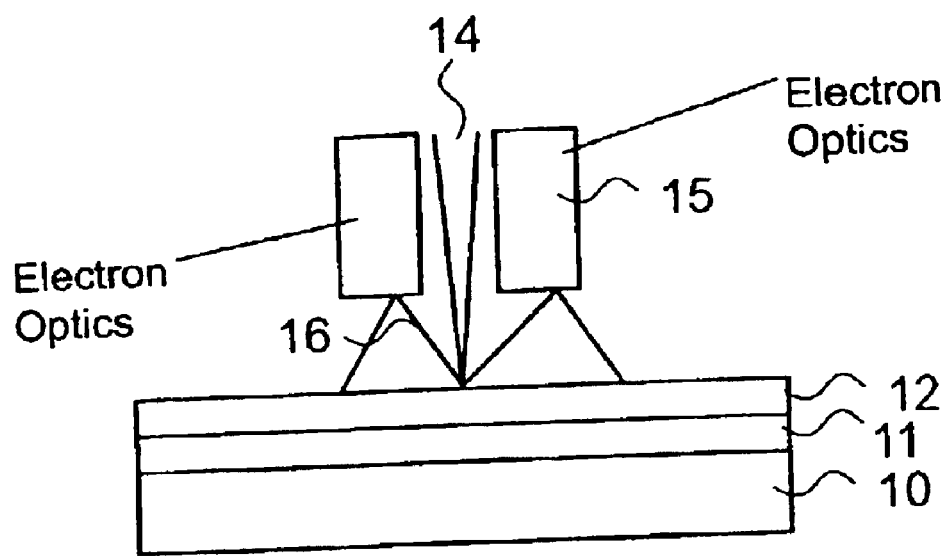
FIG. 5 is a cross sectional view in order to illustrate the scatter effects when an electron beam strikes a resist layer.

Referring now to the figures of the drawing in detail and first, particularly, to FIG. 1 thereof, there is shown a schematic view of a resist mask 12 produced in accordance with a first preferred embodiment of the inventive method. In this case, the resist mask 12 can be used to produce a photolithographic mask, as has already been explained, by way of example, in conjunction with FIG. 5. The resist mask 12 may, for example, however also be used to produce structures directly on a semiconductor wafer.

However, the starting point is always based on providing at least one layer 12 of a material that is sensitive to particle beams. Predetermined patterns 20 are then written using at least one particle beam, preferably an electron beam, in a limited area 21, for example, a chip area, of the material that is sensitive to particle beams. In order to compensate for the scatter/reflection effects that occur in this process, in particular in order to compensate for the drop-off of the background dose caused by scatter/reflection effects toward the edge of the limited area 21, at least one frame 22, which surrounds the limited area, is written into the material which is sensitive to particle beams, using at least one particle beam, so that the variations in the background dose within the limited area 21 are less than 30%, preferably less than 20%, of the maximum background dose within the limited area 21.

In this case, in the preferred exemplary embodiment shown in FIG. 1, the frame 22 is at a predetermined distance D from the limited area 21. In this case, it is particularly preferable for the dose with which the frame 22 is irradiated to be chosen such that the frame 22 can be seen when the material which is sensitive to particle beams is being developed. For example, the distance D between the frame 22 and the limited area 21 may be 3 mm, with the frame 22 likewise being 3 mm wide. The distance and the width of the frame are not critical in this case. The frame may thus, for example, also extend to the edge of the mask.

Furthermore, in this example, the frame can be irradiated with the same dose as that which the patterns 20 within the limited area 21 also receive. With electron beams, the dose is normally around 8 $\mu C/cm^2$.

Figure 2:
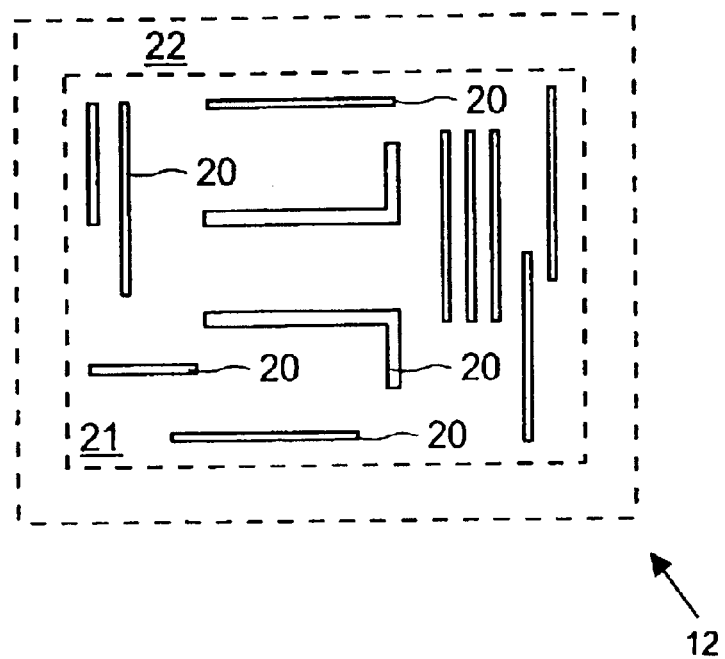
FIG. 2 is a schematic view of a mask produced according to a second preferred embodiment of the inventive method.

FIG. 2 shows a schematic view of a resist mask 12 produced in accordance with a second preferred embodiment of the inventive method. In contrast to the first embodiment, which was described in conjunction with FIG. 1, the frame 22 is now directly adjacent to the limited area 21. In this case, it is particularly preferable for the dose with which the frame is irradiated to be chosen such that the frame 22 cannot be seen when the material which is sensitive to particle beams is being developed. For electron beams, the dose is normally chosen to be less than 4 $\mu C/cm^2$ for this purpose.

Figure 3:
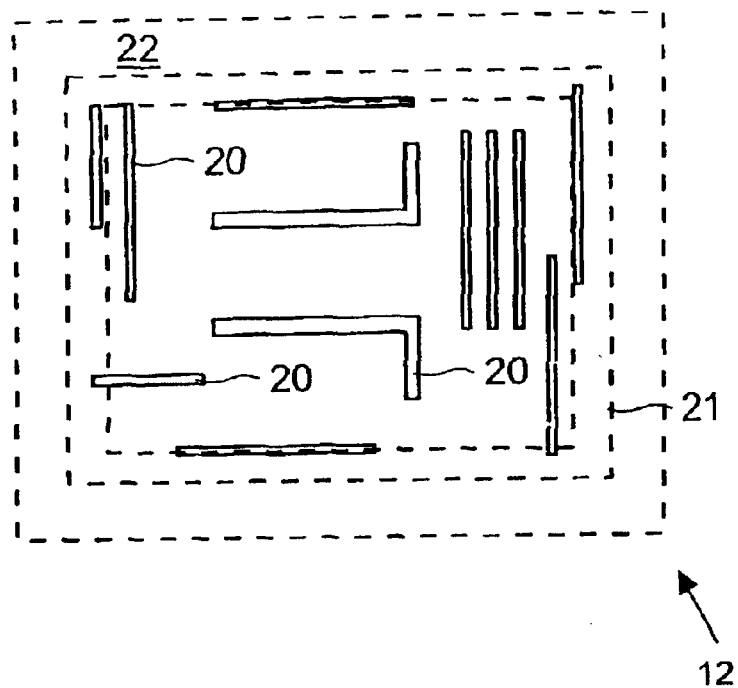
FIG. 3 is a schematic view of a mask produced according to a third preferred embodiment of the inventive method.

FIG. 3 shows a schematic view of a resist mask 12 produced in accordance with a further preferred embodiment of the inventive method. In this embodiment, the frame 22 overlaps the edge area of the limited area 21. In this case, it is particularly preferable for the dose with which the frame is irradiated to be chosen such that it corresponds to the mean background dose within the frame.

Figure 4:
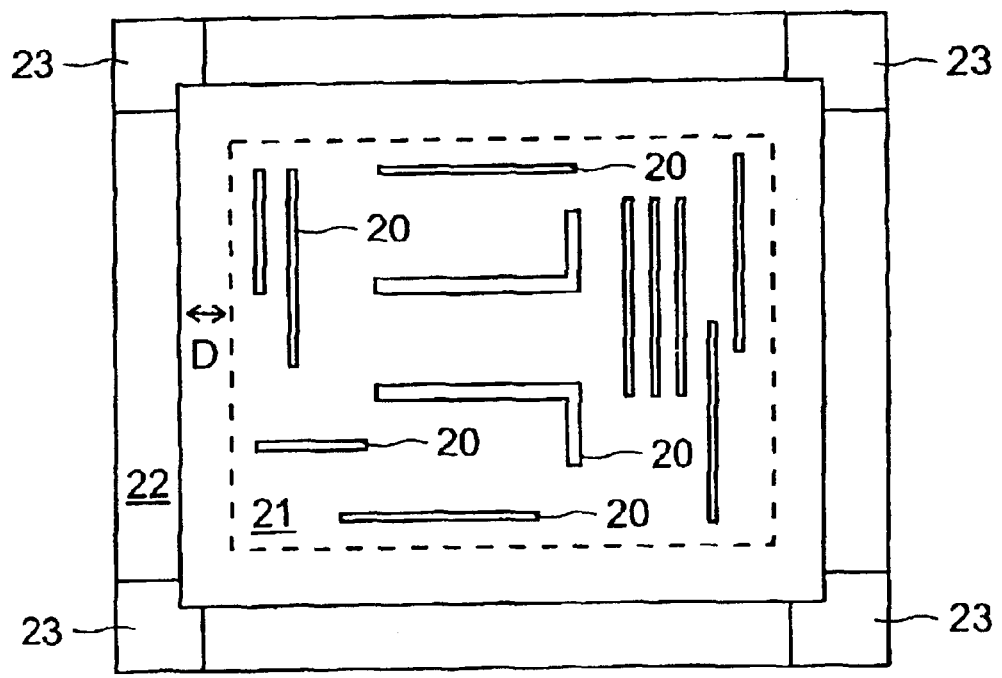
FIG. 4 is a schematic view of a mask produced according to a fourth preferred embodiment of the inventive method.

FIG. 4 shows a schematic view of a resist mask 12 produced in accordance with a further preferred embodiment of the inventive method. The embodiment corresponds essentially to the embodiment shown in FIG. 1, with the difference that, in this embodiment, the dose with which the frame 22 is irradiated is varied within the frame 22.

In the preferred embodiment shown in FIG. 4, the dose with which the frame 22 is irradiated is varied by using a higher dose to write to the corner areas 23 of the frame 22 than to the other areas of the frame 22. For example, the corner areas 23 of the frame 22 can be written to using a dose which is two or three times as great, which can easily be achieved by moving the particle beam over the corner areas 23 of the frame 22 two or more times.

The inventive method has the advantage that a considerably more homogeneous background dose, and hence considerably smaller variations in the CD measure within the area which is written to by the particle beam, can be produced in a simple and cost-effective manner. Complex calculations for compensation irradiation within the area to be written to by the particle beam can be avoided. In particular, it is possible to largely compensate for the drop-off in the background dose, and for the variations resulting from this in the dimensional stability of the edge of the limited area.

We claim:

1. A method for compensating for scatter effects in particle beam lithography, which comprises:

providing at least one layer of a material that is sensitive to particle beams;

using at least one particle beam for writing predetermined patterns in a limited area of the material that is sensitive to particle beams; and using at least one particle beam for writing at least one frame, surrounding the limited area, into the material that is sensitive to particle beams so that variations in a background dose within the limited area are less than 30% of a maximum background dose within the limited area.

2. The method according to claim 1, wherein:

the particle beam used to write the predetermined patterns is an electron beam; and the particle beam used to write the frame is an electron beam.

3. The method according to claim 1, wherein the step of writing the frame includes writing the frame at a predetermined distance from the limited area.

4. The method according to claim 3, wherein the step of writing the frame includes writing the frame with an irradiation dose such that the frame can be seen when the material that is sensitive to particle beams is being developed.

5. The method according to claim 1, wherein the step of writing the frame includes writing the frame directly adjacent the limited area.

6. The method according to claim 5, wherein the step of writing the frame includes writing the frame with an irradiation dose such that the frame cannot be seen when the material that is sensitive to particle beams is being developed.

7. The method according to claim 1, wherein the step of writing the frame includes writing the frame to overlap an edge area of the limited area.

8. The method according to claim 7, wherein the step of writing the frame includes writing the frame with an irradiation dose corresponding to a mean background dose within the frame.

9. The method according to claim 1, wherein the step of writing the frame includes writing the frame such that the variations in the background dose within the limited area are less than 20% of the maximum background dose within the limited area.

10. The method according to claim 1, wherein the step of writing the frame includes varying an irradiation dose used to write the frame.

11. The method according to claim 1, wherein the step of writing the frame includes varying an irradiation dose used to write the frame in accordance with adjacent ones of the predetermined patterns.

* * * * *